United States Patent
Morinaga et al.

(10) Patent No.: US 6,896,744 B2
(45) Date of Patent: May 24, 2005

(54) METHOD FOR CLEANING A SURFACE OF A SUBSTRATE

(75) Inventors: Hitoshi Morinaga, Fukuoka (JP); Hideaki Mochizuki, Fukuoka (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 10/718,574

(22) Filed: Nov. 24, 2003

(65) Prior Publication Data

US 2004/0099290 A1 May 27, 2004

Related U.S. Application Data

(63) Continuation of application No. PCT/JP02/04850, filed on May 20, 2002.

(30) Foreign Application Priority Data

May 22, 2001 (JP) ........................................ 2001-151960

(51) Int. Cl.$^7$ ................................................. C23G 1/02
(52) U.S. Cl. ................................. 134/28; 134/2; 134/3; 134/29
(58) Field of Search ................................. 134/28, 3, 27, 134/26, 2, 29

(56) References Cited

U.S. PATENT DOCUMENTS

| | | | | |
|---|---|---|---|---|
| 5,637,151 A | * | 6/1997 | Schulz ........................... | 134/2 |
| 5,840,127 A | * | 11/1998 | Hayashida et al. ............ | 134/2 |
| 6,146,467 A | * | 11/2000 | Takaishi et al. ................ | 134/3 |
| 6,296,714 B1 | * | 10/2001 | Matsuo et al. .................. | 134/2 |

FOREIGN PATENT DOCUMENTS

| | | |
|---|---|---|
| JP | 6-216098 | 8/1994 |
| JP | 7-86220 | 3/1995 |
| JP | 8-264500 | 10/1996 |
| JP | 2713787 | 2/1998 |
| JP | 10-256211 | 9/1998 |
| JP | 2000-49133 | 2/2000 |
| JP | 2000-91277 | 3/2000 |
| JP | 2000-91289 | 3/2000 |
| JP | 3174823 | 6/2001 |

* cited by examiner

Primary Examiner—Michael Barr
Assistant Examiner—Saeed Chaudhry
(74) Attorney, Agent, or Firm—Oblon, Spivak, McClelland, Maier & Neustadt, P.C.

(57) ABSTRACT

A highly efficient method for cleaning a substrate, whereby in the cleaning of the substrate, ① in a short time, ② both particle contaminants and metal contaminants can be removed, and ③ a problem associated therewith, such as re-deposition of contaminants or a dimensional change due to etching, can be remarkably reduced, and which has the following characteristics.

A method for cleaning a surface of a substrate, which comprises at least the following steps (1) and (2), wherein the step (2) is carried out after carrying out the step (1):

Step (1): A cleaning step of cleaning the surface of the substrate with an alkaline cleaning agent containing a completing agent, and Step (2): A cleaning step employing a cleaning agent having a hydrofluoric acid content C (wt %) of from 0.03 to 3 wt %, wherein the cleaning time t (seconds) of the substrate with said cleaning agent is at most 45 seconds, and C and t satisfy the relationship of $0.25 \leq tC^{1.29} \leq 5$.

19 Claims, No Drawings

US 6,896,744 B2

METHOD FOR CLEANING A SURFACE OF A SUBSTRATE

TECHNICAL FIELD

The present invention relates to a cleaning method for cleaning a surface of a substrate for a device in a process for producing e.g. a semiconductor device or a display device. Particularly, it relates to a method for cleaning a surface of a substrate, whereby both metals and fine particles as contaminants on the substrate can be removed in a short time to highly clean the surface of the substrate.

BACKGROUND ART

In a process for producing a semiconductor device such as a microprocessor, a memory or CCD, or a flat panel display device such as a TFT liquid crystal, formation of a pattern or formation of a thin film is carried out in a submicron size on the surface of a substrate of e.g. silicon (Si), silicon oxide ($SiO_2$) or glass. And, in such production, it is very important to reduce the very small amount of contaminants on the substrate surface in each step for the production.

Among contaminants, particularly metal contaminants or particle contaminants deteriorate the yield or the electrical characteristics of the device. Accordingly, it is necessary to reduce contaminants as far as possible within the step wherein the contaminants are formed and then transfer the substrate to the next step. To remove the contaminants, it is common to clean the substrate surface with a cleaning agent.

In recent years, in the production of devices, further improvement in the production efficiency, such as improvement in the number of substrates treated per unit time, is required. In the production of a substrate having a device which tends to be increasingly microsized and highly integrated, a cleaning method is desired which is capable of highly cleaning the substrate surface quickly and which is excellent in the ability to remove both metal contaminants and particle contaminants on the metal surface.

It is commonly known that for the removal of particle contaminants, cleaning with an alkaline solution is effective. In cleaning the surface of a Si substrate or a $SiO_2$ substrate for a semiconductor device, or a glass substrate for a display device, an aqueous alkaline solution such as an aqueous ammonia solution, an aqueous potassium hydroxide solution or an aqueous tetramethylammonium hydroxide solution, is employed. Further, cleaning (so-called "SC-1 cleaning" or "APM cleaning") with a cleaning agent (so-called "SC-1 cleaning agent" or "APM cleaning agent") comprising ammonia, hydrogen peroxide and water, is also widely employed.

On the other hand, it is known that for the removal of metal contaminants, cleaning with an aqueous acidic solution is effective. In cleaning the surface of a Si substrate or a $SiO_2$ substrate for a semiconductor device, or a glass substrate surface for a display device, one having an acid such as hydrochloric acid, nitric acid, sulfuric acid or hydrofluoric acid diluted with water, is employed as a cleaning agent. Further, cleaning (so-called "SC-2 cleaning" or "HPM cleaning") with a cleaning agent (so-called "SC-2 cleaning agent" or "HPM cleaning agent") comprising hydrochloric acid, hydrogen peroxide and water, is also widely employed.

In order to remove both particle contaminants and metal contaminants on the substrate surface, cleaning is carried out by a combination of such cleaning methods in a plurality of steps. As a method for cleaning contaminants on the surface of a substrate for a semiconductor device, a so-called RCA cleaning (Kern and Puotinen: RCA Review, pp. 187–206, June (1970), etc.) is widely used in which particle contaminants are removed by SC-1 cleaning and then metal contaminants are removed by SC-2 cleaning. Further, in order to remove metal contaminants firmly chemically bonded to Si or $SiO_2$ on the substrate surface, or a very small amount of metal contaminants taken into the interior of the surface layer of the substrate, it is effective to etch the surface layer of the substrate with a dilute hydrofluoric acid aqueous solution having a hydrofluoric acid content of from about 0.25 to 1 wt % (hereinafter sometimes referred to simply as "dilute hydrofluoric acid"). Particularly, aluminum (Al) and copper (Cu) are likely to react with Si or $SiO_2$ on the substrate surface to form a firm chemical bond and are likely to be taken into the vicinity of the surface layer of the substrate, and in recent years, it has been found that in order to clean such a substrate surface, it is most effective to employ a method of removing them by etching the surface layer of the substrate (Morinaga et al., The Electrochemical Society Proceeding Series PV99-36, pp. 585–592, Pennington, N.J. (2000) etc.). Thus, after SC-1 cleaning or after SC-2 cleaning, or between SC-1 cleaning and SC-2 cleaning, cleaning with dilute hydrofluoric acid is carried out, so that a highly clean surface can be obtained by carrying out cleaning in a total of three steps. In such a two step or three step cleaning method, it usually takes from 1 to 15 minutes per one cleaning step, and it requires a total of a few tens minutes.

Further, as apparatus for cleaning the surface of a substrate for a device, there are two types of typical ones. One type is a batch system cleaning apparatus wherein a plurality of substrates accommodated in a cassette is immersed and cleaned in a cleaning tank which usually contains a cleaning agent. The other type is a sheet system cleaning apparatus wherein a single sheet of a substrate is mounted on a holder, and usually, while rotating the substrate (for example, if the substrate is a disk, it is rotated in a circumferential direction), a cleaning agent is sprayed to the substrate surface.

The batch type cleaning apparatus is capable of treating a large number of substrates per unit time, but has problems such that the apparatus is large, so-called re-deposition of contaminants (crosscontamination) among substrates is likely to result such that contaminants detached from a device-formed surface of a substrate or from its rear side will deposit on another device-formed surface, and even when it is desired to clean only one sheet, a large amount of the cleaning agent will be required.

On the other hand, the sheet system cleaning apparatus is free from crosscontamination and the apparatus is small, but it has a problem that the number of substrates which can be treated per unit time, is small, since only one sheet is cleaned each time.

As mentioned above, in the conventional method for cleaning the substrate surface, the substrate surface has been highly cleaned by a cleaning method having a plurality of steps including SC-1 cleaning, SC-2 cleaning and further dilute hydrofluoric acid cleaning, etc. Accordingly, there have been problems that the cleaning time is long, and the production efficiency is poor. Particularly by a sheet system cleaning apparatus wherein only one substrate sheet is cleaned each time, the number of substrates which can treated per unit time per one apparatus is small, whereby there have been problems that many cleaning apparatus are required, and such is disadvantageous from the viewpoint of costs.

Further, in the dilute hydrofluoric acid cleaning, various problems have been noticed in recent years, for example, a problem such that during usual cleaning treatment for from 1 to 5 minutes by means of an aqueous hydrofluoric acid solution having a concentration of about 0.5 wt %, the substrate surface (a $SiO_2$ film or the like) will be etched by at least 10 Å, whereby the dimensional precision of the device on the substrate surface will be impaired. Such a problem is expected to be rapidly noticed in future as the device will be increasingly microsized, and the gate oxide film will be thinner.

Further, there are also problems such that particles are likely to deposit and contaminate the hydrophobic Si surface exposed by etching (usually, particles are more likely to deposit on a hydrophobic surface), and further, a stain-like soiling which forms when a waterdrop remaining on a hydrophobic surface dries up, i.e. a so-called watermark, is likely to form.

In order to control such etching of $SiO_2$, a cleaning method is also proposed wherein, although the cleaning time is the same as before, the hydrofluoric acid concentration is extremely reduced, and for example, the substrate surface is cleaned with an extremely dilute hydrochloric acid aqueous solution having a very small amount at a level of e.g. 10 wt ppm of hydrofluoric acid added to pure water (JP-A-3-190130, etc.). However, by such a cleaning method, since the hydrofluoric acid concentration is extremely low, it requires about 5 minutes for only cleaning with this hydrofluoric acid aqueous solution, whereby the production efficiency is still low. In addition, in a case where this method is applied to a sheet cleaning apparatus, a large amount of the cleaning agent will be required, and accordingly a large amount of an acid waste liquid will be formed, and its disposal will be problematic.

DISCLOSURE OF THE INVENTION

The present invention has been made to solve the above-mentioned problems, and it is an object of the present invention to provide a highly efficient method for cleaning a substrate, whereby in the process for producing e.g. a semiconductor device or a display device, with respect to a substrate for the device, ① in a short time, ② both particle contaminants and metal contaminants can be removed, and ③ re-deposition of contaminants or a dimensional change due to etching is substantially reduced.

In order to solve the above problems, the present inventors have conducted an extensive study and as a result, have firstly found an unexpected fact that rather than cleaning for a long time by means of an extremely dilute hydrofluoric acid aqueous solution as mentioned above, a higher effect for removing metal contaminants can be obtained by cleaning for a specified time or less by means of an aqueous hydrofluoric acid solution having a specific concentration or more, specifically 0.03 wt % or more. Further, it has been found that in cleaning with an aqueous hydrofluoric acid solution, sufficient removal of metal contaminants and solution to the (above-mentioned) problem such as the dimensional change by etching can both be satisfied in a case where the hydrofluoric acid concentration (wt %) and the cleaning time (seconds) are represented by a specific relationship.

As a result of a further study, it has been found that by combining the step of cleaning the substrate surface with an alkaline cleaning agent with the above-mentioned cleaning step by means of an aqueous hydrofluoric acid solution i.e. the step of cleaning the substrate surface for a specified time or less by means of a cleaning agent having a hydrofluoric acid content of a specific level or more, wherein the hydrofluoric acid concentration in the cleaning agent and the cleaning time satisfy a specific relationship, particle contaminants and metal contaminants on the substrate surface can together be removed in a very short time, and an excellent effect can be obtained such that there will be no substantial problem such as a watermark, re-deposition of particles or a dimensional change due to etching, and the present invention has been completed.

Namely, the gist of the present invention resides in a method for cleaning a surface of a substrate, which comprises at least the following steps (1) and (2), wherein the step (2) is carried out after carrying out the step (1):

Step (1): A cleaning step of cleaning the surface of the substrate with an alkaline cleaning agent containing a completing agent, and Step (2): A cleaning step employing a cleaning agent having a hydrofluoric acid content C (wt %) of from 0.03 to 3 wt %, wherein the cleaning time t (seconds) of the substrate with said cleaning agent is at most 45 seconds, and C and t satisfy the relationship of $0.25 \leq tC^{1.29} \leq 5$.

Further, another gist of the present invention resides in a method for cleaning a surface of a substrate, which comprises at least the following steps (2) and (3), wherein the step (3) is carried out after carrying out the step (2):

Step (2): A cleaning step employing a cleaning agent having a hydrofluoric acid content C (wt %) of from 0.03 to 3 wt %, wherein the cleaning time t (seconds) of the substrate with said cleaning agent is at most 45 seconds, and C and t satisfy the relationship of $0.25 \leq tC^{1.29} \leq 5$, and Step (3): A cleaning step of cleaning the surface of the substrate with an alkaline cleaning agent.

BEST MODE FOR CARRYING OUT THE INVENTION

Now, the present invention will be described in detail. There are many matters which are common to the steps (1) and (3), and they will be described together.

(A) Alkaline Cleaning Agent (A-1) Alkaline Component

The alkaline cleaning agent to be used in the present invention is an aqueous alkaline solution containing an alkaline component and having a pH value exceeding 7. The alkaline component in the solution is not particularly limited, but, as typical ones, ammonium hydroxide (an aqueous ammonia solution) and an organic alkali may be mentioned. As the organic alkali, a quaternary ammonium hydroxide, or an amine such as amine or amino alcohol, may be mentioned. As the quaternary ammonium hydroxide, one having an alkyl group having from 1 to 4 carbon atoms and/or a hydroxyalkyl group, is preferred. As the alkyl group, an alkyl group having from 1 to 10 carbon atoms, such as a methyl group, an ethyl group, a propyl group or a butyl group, may be mentioned. As the hydroxyalkyl group, a hydroxyalkyl group having from 1 to 10 carbon atoms, such as hydroxymethyl, hydroxyethyl, hydroxypropyl or hydroxybutyl, may be mentioned. As such a quaternary ammonium hydroxide, tetramethylammonium hydroxide (TMAH), tetraethylammonium hydroxide, trimethyl (hydroxyethyl)ammonium hydroxide (so-called choline) or triethyl(hydroxyethyl)ammonium hydroxide may, for example, be specifically mentioned. As other amines, ethylenediamine, monoethanolamine, trimethanolamine, etc., may be mentioned.

Among the above-mentioned alkaline components, for such reasons as the cleaning effects, little metal residue, economical efficiency, stability of the cleaning agent, as the alkaline component, ammonium hydroxide, tetramethylammonium hydroxide (TMAH) or trimethyl(hydroxyethyl) ammonium hydroxide (so-called choline) is, for example, preferred, and particularly preferred is ammonium hydroxide. These alkaline components may be used alone or in combination of two or more of them in an optional ratio. The concentration of the alkaline component in the cleaning agent may suitably be selected, but it is usually from 0.001 to 5 wt %, particularly preferably from 0.002 to 1 wt %. If the concentration of the alkaline component is too low, no adequate effect for removal of contaminants, as the object of the present invention, can be obtained. On the other hand, if the concentration is too high, a high effect corresponding to the high concentration cannot be expected, such being undesirable, since such is not only economically disadvantageous but also increases a danger of damaging the substrate surface by etching.

(A-2) Complexing Agent

It is preferred to incorporate a complexing agent in the alkaline cleaning agent to be used in the present invention, whereby it is possible to obtain an extremely highly clean surface having metal contaminants on the substrate surface further reduced. In the alkaline cleaning agent to be used in the step (1) in the present invention, it is essential to contain a complexing agent.

As the complexing agent to be used in the present invention, a conventional optional one may be employed. When the complexing agent is to be selected for use, such selection may be made from a comprehensive standpoint taking into consideration e.g. the contaminated level of the substrate surface, the type of metals, the clean level required for the substrate surface, the cost of the complexing agent, chemical stability, etc. For example, the following may be mentioned.

(1) A Compound Having Nitrogen as a Donor Atom, and a Carboxyl Group and/or a Phosphonic Acid Group For example, an amino acid such as glycine; a nitrogen-containing carboxylic acid such as iminodiacetatic acid, nitrilotriacetatic acid, ethylenediamine tetracetatic acid (EDTA), trans-1,2-diaminocyclohexane tetracetatic acid (CyDTA), diethylenetriamine pentacetatic acid (DTPA), or triethylenetetramine hexaacetatic acid (TTHA); or a nitrogen-containing phosphonic acid, such as ethylenediamine tetrakis(methylenephosphonic acid) (EDTPO), nitrilotris(methylenephosphonic acid) (NTPO), or propylene diaminetetra(methylenephosphonic acid) (PDTMP), may be mentioned.

(2) A Compound Having an Aromatic Hydrocarbon Ring and at Least Two OH Groups and/or $O^-$ Groups Directly Bonded to Carbon Atoms Constituting the Ring For example, a phenol such as catechol, resorcinol or tiron, and its derivatives may be mentioned.

(3) A Compound Having Both of the Above Structures (1) and (2)

(3-1) Ethylenediamine di-o-hydroxyphenyl Acetic Acid (EDDHA) and its Derivatives For example, an aromatic nitrogen-containing carboxylic acid, such as ethylenediamine di-o-hydroxyphenyl acetic acid (EDDHA), ethylenediamine-N,N'-bis[(2-hydroxy-5-methylphenyl)acetic acid] (EDDHMA), ethylene diamine-N,N'-bis[(2-hydroxy-5-chlorophenyl) acetic acid] (EDDHCA), or ethylenediamine-N,N'-bis[(2-hydroxy-5-sulfophenyl)acetic acid] (EDDHSA); or an aromatic nitrogen-containing phosphonic acid, such as ethylenediamine-N,N'-bis[(2-hydroxy-5-methylphenyl) phosphonic acid], or ethylene diamine-N,N'-bis[(2-hydroxy-5-phosphophenyl)phosphonic acid], may be mentioned.

(3-2) N,N'-bis(2-hydroxybenzyl)ethylenediamine-N,N'-diacetic Acid (HBED) and its Derivatives For example, N,N'-bis(2-hydroxybenzyl) ethylenediamine-N,N'-diacetic acid (HBED), N,N'-bis(2-hydroxy-5-methylbenzyl)ethylenediamine-N,N'-diacetic acid (HMBED), N,N'-bis(2-hydroxy-5-chlorobenzyl) ethylenediamine-N,N'-diacetic acid, may be mentioned.

(4) Others

An amine such as ethylenediamine, 8-quinolinol or o-phenanthroline; a carboxylic acid such as formic acid, acetic acid, oxalic acid or tartaric acid; a hydrogen halide such as hydrofluoric acid, hydrochloric acid, hydrogen bromide or hydrogen iodide, or salts thereof; an oxo acid such as phosphoric acid or condensed phosphoric acid, or salts thereof.

Such a complexing agent may be one in the form of an acid, or one in the form of a salt such as an ammonium salt.

Among the above-mentioned complexing agents, from such reasons as the cleaning effects, chemical stability, etc., a nitrogen-containing carboxylic acid such as ethylenediamine tetracetic acid (EDTA) or diethylenetriamine pentacetic acid (DTPA); a nitrogen-containing phosphonic acid such as nitrilotris(methylenephosphonic acid) (NTPO), ethylenediaminetetrakis(methylenephosphonic acid) (EDTPO) or propylenediaminetetra(methylenephosphonic acid) (PDTMP); ethylenediamine di-o-hydroxyphenyl acetic acid (EDDHA) and its derivatives; and N,N'-bis(2-hydroxybenzyl)ethylenediamine-N,N'-diacetic acid (HBED) are, for example, preferred.

Among them, from the viewpoint of the cleaning effects, ethylenediamine di-o-hydroxyphenylacetic acid (EDDHA), ethylenediamine-N,N'-bis[(2-hydroxy-5-methylphenyl)acetic acid] (EDDHMA), diethylenetriamine pentacetic acid (DTPA), ethylenediamine tetracetic acid (EDTA), nitrilotris (methylenephosphonic acid) (NTPO) or propylenediaminetetra(methylenephosphonic acid) (PDTMP) is preferred.

These complexing agents may be used alone or in combination of two or more of them in an optional ratio. The concentration of the complexing agent in the cleaning agent may optionally be selected depending upon the type and amount of contaminant metal impurities and the clean level required for the substrate surface, and it is usually from 1 to 10,000 wt ppm, preferably from 5 to 1,000 wt ppm, particularly preferably from 10 to 200 wt ppm. If the concentration of the complexing agent is too low, no adequate effects for removing contaminants or preventing deposition by the complexing agent, can be obtained. On the other hand, if the concentration is too high, a high effect corresponding to the high concentration cannot be expected, such being undesirable, since such is not only economically disadvantageous, but also a danger increases such that the complexing agent will deposit on the substrate surface and remains after the surface treatment.

Further, in a reagent which is commonly sold, the complexing agent may sometimes contains metal impurities such as iron (Fe) or zinc (Zn) in a concentration of from about 1 to a few thousands ppm. Accordingly, the complexing agent to be used in the present invention may sometimes be a metal contamination source. Such metal impurities are present in the form of a stable complex formed together with the complexing agent immediately after the preparation of the surface treating agent, but as the surface treating agent is used for a long time, the complexing agent will be decomposed, and the metals will be freed and may likely be deposited on the substrate surface. Therefore, it is preferred to preliminarily remove the contained metal impurities such as Fe, Al, Zn, etc., from the complexing agent to be used in the present invention so that each content will be not more than 5 pm, particularly preferably not more than 2 ppm. In order to obtain such a purified complexing agent, purification may be carried out by e.g. a method wherein the complexing agent is dissolved in an acidic or alkaline aqueous solution, then insoluble impurities are removed by e.g. separation by filtration, and again, crystals of the complexing agent are precipitated and separated by neutralization.

Even when a complexing agent is incorporated to the alkaline cleaning agent to be used in the present invention, an optional one may be used as the alkaline component. However, ammonium hydroxide, tetramethylammonium hydroxide (TMAH) or trimethyl(hydroxyethyl)ammonium hydroxide (so-called choline) is, for example, preferred, and ammonium hydroxide is particularly preferred, for such reasons as the metal residue being little, the economical efficiency, the stability of the cleaning agent, etc.

(A-3) Other Additives Such as Surfactants

To the alkaline cleaning agent to be used in the present invention, an oxidizing agent such as hydrogen peroxide, ozone or oxygen, may optionally be incorporated. In a case where in a process for cleaning a semiconductor device substrate, the surface of a bare silicon substrate (a silicon substrate having no oxide film) is to be cleaned, it is possible to control etching or surface roughing of the substrate by incorporating an oxidizing agent. When hydrogen peroxide is to be incorporated to the alkaline cleaning agent to be used in the present invention, it is usually employed so that the concentration of hydrogen peroxide in the entire liquid of the cleaning agent will be within a concentration range of from 0.001 to 5 wt %, preferably from 0.01 to 1 wt %.

Further, it is preferred to further incorporate a surfactant to the alkaline cleaning agent to be used in the present invention, since it is thereby possible to improve the performance for the removal of the particle contaminants or the organic contaminants on the substrate surface.

As such a surfactant, a conventional optional one may be employed. When the surfactant is to be selected, such selection may be made from a comprehensible standpoint taking into consideration the contaminated level of the substrate surface, the type of the particles or organic contaminants, a clean level required for the substrate surface, the cost of the surfactant, chemical stability, etc. As such a surfactant, an anionic, cationic, amphoteric or nonionic surfactant may be mentioned. Among them, an anionic, amphoteric or nonionic surfactant is preferred. Particularly preferred is an anionic surfactant. These surfactants may be used alone or in an optional combination of two or more different types. Among them, a combination of an anionic surfactant and a nonionic surfactant is preferred from the viewpoint of the effect for cleaning contaminants.

As an anionic surfactant, a carboxylic acid type, a sulfonic acid type, a sulfate type or a phosphate type may be mentioned. As an amphoteric surfactant, an amino acid type or a betaine type may, for example, be mentioned. As a nonionic surfactant, a polyethylene glycol type or a polyhydric alcohol type may, for example, be mentioned.

Among anionic surfactants, a sulfonic acid type (having —$SO_3$— groups) or a sulfate type (—$OSO_3$—) is preferred. Specifically, a compound having at least one —$SO_3$— or —$OSO_3$— group, is preferred. Such compounds may be used alone or in an optional combination of two or more types.

As surfactants having —$SO_3$— groups, the following compounds ① to ⑨ may, for example, be mentioned.

① Alkylsulfonic Acid Type Compound

As an alkylsulfonic acid type compound, a compound represented by the following formula (1) may be mentioned.

$RSO_3X$  Formula (1)

(In the formula, R is an alkyl group, preferably a $C_{8-20}$ alkyl group, and X is hydrogen, a cation atom or a cation atomic group.)

As an alkylsulfonic acid, $C_8H_{17}SO_3H$ and its salts, $C_9H_{19}SO_3H$ and its salts, $C_{10}H_{21}SO_3H$ and its salts, $C_{11}H_{23}SO_3H$ and its salts, $C_{12}H_{25}SO_3H$ and its salts, $C_{13}H_{27}SO_3H$ and its salts, $C_{14}H_{29}SO_3H$ and its salts, $C_{15}H_{31}SO_3H$ and its salts, $C_{16}H_{33}SO_3H$ and its salts, $C_{17}H_{35}SO_3H$ and its salts, and $C_{18}H_{37}SO_3H$ and its salts, may, for example, be mentioned.

② Alkylbenzenesulfonic Acid Type Compound

As an alkylbenzenesulfonic acid type compound, a compound represented by the following formula (2) may be mentioned.

R-ph-SO$_3$X  Formula (2)

(in the formula, R is an alkyl group, preferably a $C_{8-20}$ alkyl group, X is hydrogen, a cation atom or a cation atomic group, and ph represents a phenylene group.)

As an alkylbenzenesulfonic acid, dodecylbenzenesulfonic acid and its salts, may, for example, be mentioned.

③ Alkylnaphthalenesulfonic Acid Type Compound

As an alkylnaphthalenesulfonic acid type compound, a compound represented by the following formula (3) may be mentioned.

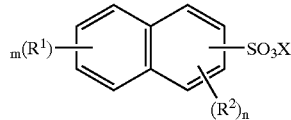

Formula (3)

(in the formula, each of $R^1$ and $R^2$ is an alkyl group, preferably a $C_{1-10}$ alkyl group, X is hydrogen, a cation atom or a cation atomic group, and each of m and n is an integer of from 0 to 4, provided $1 \leq m+n \leq 7$, preferably $1 \leq m+n \leq 4$.)

As an alkylnaphthalenesulfonic acid type compound, dimethylnaphthalenesulfonic acid and its salts may, for example, be mentioned.

④ Methyltaurine Acid Type Compound

As a methyltaurine acid type compound, a compound represented by the following formula (4) may be mentioned.

RCON(CH$_3$)CH$_2$CH$_2$SO$_3$X  Formula (4)

(in the formula, R is a hydrocarbon group, preferably a saturated or unsaturated hydrocarbon group of $C_nH_{2n+1}$, $C_nH_{2n-1}$, $C_nH_{2n-3}$ or $C_nH_{2n-5}$, X is hydrogen, a cation atom or a cation atomic group, and n is an integer of usually from 8 to 20, preferably from 13 to 17. If n representing the carbon number of the hydrocarbon group is too small, the ability to remove deposited particles tends to be low.)

As a methyltaurine acid type compound,
$C_{11}H_{23}$CON(CH$_3$)CH$_2$CH$_2$SO$_3$H and its salts,
$C_{13}H_{27}$CON(CH$_3$)CH$_2$CH$_2$SO$_3$H and its salts,
$C_{15}H_{31}$CON(CH$_3$)CH$_2$CH$_2$SO$_3$H and its salts,
$C_{17}H_{35}$CON(CH$_3$)CH$_2$CH$_2$SO$_3$H and its salts,
$C_{17}H_{33}$CON(CH$_3$)CH$_2$CH$_2$SO$_3$H and its salts,
$C_{17}H_{31}$CON(CH$_3$)CH$_2$CH$_2$SO$_3$H and its salts, and
$C_{17}H_{29}$CON(CH$_3$)CH$_2$CH$_2$SO$_3$H and its salts, may, for example, be mentioned.

⑤ Alkyldiphenyl Ether Disulfonic Acid Type Compound

As an alkyldiphenyl ether disulfonic acid type compound, a compound represented by the following formula (5) may be mentioned.

R-ph(SO$_3$X)—O-ph-SO$_3$X  Formula (5)

(in the formula, R is an alkyl group, preferably a $C_{8-20}$ alkyl group, X is hydrogen, a cation atom or a cation atomic group, and ph is a phenylene group.)

As an alkyldiphenyl ether disulfonic acid type compound, nonyl diphenyl ether disulfonic acid and its salts, and dodecylphenyl ether disulfonic acid and its salts, may, for example, be mentioned.

⑥ Sulfosuccinic Acid Diester Type Compound

As a sulfosuccinic acid diester type compound, a compound represented by the following formula (6) may be mentioned.

R—O—CO—CH$_2$—(R—O—CO—)CH—SO$_3$X  Formula (6)

(in the formula, R is hydrogen or an alkyl group, preferably a $C_{4-20}$ alkyl group, and X is hydrogen, a cation atom or a cation atomic group.)

As a sulfosuccinic acid diester, di-2-ethylhexylsulfosuccinic acid and its salts, and lauryl sulfosuccinic acid and its salts, may, for example, be mentioned.

⑦ α-olefin Sulfonic Acid Type Compound

As an α-olefin sulfonic acid type compound, a mixture of a compound represented by the following formula (7) and a compound represented by the following formula (8), may be mentioned.

RCH=CH(CH$_2$)$_m$SO$_3$X  Formula (7)

RCH$_2$CH(OH)(CH$_2$)$_n$SO$_3$X  Formula (8)

(in the formulae, R is an alkyl group, preferably a $C_{4-20}$ alkyl group, X is hydrogen, a cation atom or a cation atomic group, m is an integer of from 1 to 10, and n is an integer of from 1 to 10.)

⑧ Naphthalenesulfonic Acid Condensate

As a naphthalenesulfonic acid condensate, β-naphthalenesulfonic acid formalin condensate and its salts may, for example, be mentioned.

⑨ Fluorine Type Surfactant Having Hydrogen in an Alkyl Group or a Hydrocarbon Group in any one of Surfactants Represented by the Above ① to ⑧, Substituted by Fluorine Among these surfactants, an alkyl benzene sulfonic acid type compound, an alkyl diphenyl ether disulfonic acid type compound or a sulfosuccinic acid diester type compound is preferably employed in view of the excellent ability to remove particle contaminants. As surfactants having —OSO$_3$— groups, the following compounds ① to ④ may be mentioned.

① Alkylsulfuric Acid Ester Type Compound

As an alkyl sulfuric acid ester type compound, a compound represented by the following formula (9) may be mentioned.

ROSO$_3$X  Formula (9)

(in the formula, R is an alkyl group, a preferably a $C_{8-20}$ alkyl group, and X is hydrogen, a cation atom or a cation atomic group.)

As an alkyl sulfuric acid ester type compound, dodecyl sulfuric acid ester and its salts, may, for example, be mentioned.

② Alkyl Ether Sulfuric Acid Ester Type Compound

As an alkyl ether sulfuric acid ester type compound, a compound represented by the following formula (10) may be mentioned.

RO(CH$_2$CH$_2$O)$_n$SO$_3$X  Formula (10)

(in the formula, R is an alkyl group, preferably a $C_{8-20}$ alkyl group, X is hydrogen, a cation atom or a cation atomic group, and n is the addition mols of ethyleneoxide and is usually an integer of from 1 to 10, preferably from 2 to 4.)

As an alkyl ether sulfuric acid ester type compound, the oxyethylene lauryl ether sulfuric acid ester and its salts may, for example, be mentioned.

③ Alkylphenyl Ether Sulfuric Acid Ester Type Compound

As an alkylphenyl ether sulfuric acid ester type compound, a compound represented by the following formula (11), a sulfated oil, a sulfated fatty acid ester type compound or a sulfated olefin type compound may be mentioned.

Formula (11)

(in the formula, R is an alkyl group, preferably a $C_{8-20}$ alkyl group, X is hydrogen, a cation atom or a cation atomic group, n is the addition mols of ethyleneoxide and is usually an integer of from 1 to 10, preferably from 2 to 4, and ph is a phenylene group.)

④ A Fluorine Type Surfactant Having Hydrogen in an Alkyl Group in a Surfactant Represented by the Above ① to ③ Substituted by Fluorine The surfactant having —OSO$_3$— groups is excellent in the ability to remove particles, but as the alkaline nature becomes strong, the effects tend to be low. Although it cannot be generalized since it may vary depending upon the type, but at pH 10 to 12, the surfactant having —SO$_3$— groups shows a higher ability to remove particles.

Among nonionic surfactants, as a polyethylene glycol type, a polyoxyethylenealkylphenyl ether, a polyoxyethylenealkyl ether, a polyoxyethylene fatty acid ester, a polyoxyethylene sorbitan fatty acid ester, a polyoxyethylene/polyoxypropylene/block copolymer, or a polyoxyethylene/polyoxybutylene block polymer, may, for example, be mentioned. As a polyhydric alcohol type, a glycerol fatty acid ester, or a sorbitan fatty acid ester may, for example, be mentioned. Among such surfactants, a polyoxyethylene alkyl ether, a polyoxyethylene/polyoxypropylene/block polymer or a polyoxyethylene/polyoxybutylene block polymer, may, for example, be employed preferably as it is excellent in the ability to remove contaminants and it is excellent in the biodegradability.

The concentration of the surfactant in the alkaline cleaning agent to be used in the present invention is usually from 0.0001 to 0.5 wt %, preferably from 0.0003 to 0.1 wt %, based on the cleaning agent. If the concentration of the surfactant is too low, no adequate performance to remove particle contaminants by the surfactant can be obtained. On the other hand, even if the concentration is too high, there will be no change in the performance to remove particle contaminants, and there may be a case where foaming tends to be so remarkable that such is not useful for a cleaning process, or the load tends to increase when the waste liquid is subjected to biodegradation treatment.

The surfactant to be added to the alkaline cleaning agent to be used in the present invention, may be added in the form of either a salt type or an acid type. As the salt type, an alkali metal salt such as a sodium or potassium salt, an ammonium salt, or a primary, secondary or tertiary amine salt, may, for example, be mentioned. In the cleaning of the substrate surface in the process for producing a semiconductor device or a display device, the surfactant to be used may preferably be in the form of an acid type or in the form of an ammonium salt, a monoethanolamine salt or a triethanolamine salt, containing no metal salt, in consideration of the fact that metal contaminants adversely affect the transistor performance.

In the alkaline cleaning agent to be used in the present invention, other components may further be contained. As such other components, an anticorrosive such as an organic sulfur-containing compound (such as 2-mercapto thiazoline, 2-mercapto imidazoline, 2-mercapto ethanol or thioglycerol), an organic nitrogen-containing compound (such as benzotriazole, 3-aminotriazole, N(R)$_3$ (wherein R is a $C_{1-4}$ alkyl group), N(ROH)$_3$ (wherein R is a $C_{1-4}$ alkyl group), urea, or thiourea), a water-soluble polymer (such as polyethylene glycol or polyvinyl alcohol) or an alkyl alcohol type compound (such as ROH (wherein R is a $C_{1-4}$ alkyl group)), an acid such as sulfuric acid or hydrochloric acid, a reducing agent such as hydrazine, and a dissolved gas such as hydrogen, argon or nitrogen, may, for example, be mentioned.

(A-4) Solvent for the Alkaline Cleaning Agent

As the solvent for the alkaline cleaning agent to be used in the present invention, water, an organic solvent or a mixed solvent thereof may be mentioned. Among them, as the solvent, water is preferred from the viewpoint of the waste liquid treatment cost. As such water, deionized water, preferably ultrapure water, is usually employed. Electrolyzed water obtained by electrolysis of water, or hydrogenated water having hydrogen gas dissolved in water, by itself, has excellent particle removing ability or deposition-preventing ability as compared with water, and preferably used alone as a solvent or as mixed with other solvents.

(A-5) pH of the Alkaline Cleaning Agent

The pH of the alkaline cleaning agent to be used in the present invention is preferably at least 9 with a view to removing particles or preventing deposition, although it may depend upon the alkaline component to be used and other additives such as the complexing agent. The pH may be at least 9, but it is usually pH 9 to 12, particularly preferably pH 9.5 to 11.5. Further, within a range not to impair the effects of the present invention, a known pH controlling agent may be employed. Even if the pH is too high, a high effect corresponding to the high pH value cannot be expected, such being not only economically disadvantageous in that a large amount of alkali is required, but also a danger increases such that the substrate surface will be damaged by etching.

(B) Cleaning by Hydrofluoric Acid in the Step (2)

The cleaning of the substrate surface employing the hydrofluoric acid-containing cleaning agent used in the step (2) of the present invention, is a step of cleaning the substrate surface for a specified time or less by means of a cleaning agent having a specific hydrofluoric acid content. Specifically, it is a cleaning step characterized in that a cleaning agent having a hydrofluoric acid content C (wt %) of from 0.03 to 3 wt %, the cleaning time t (seconds) of the substrate with said cleaning agent is at most 45 seconds, and C and t satisfy the relationship of $0.25 \leq tC^{1.29} \leq 5$.

(B-1) Regarding $tC^{1.29}$ in the Step (2)

The step (2) in the present invention is characterized in that the relationship between the hydrofluoric acid content C (wt %) in the cleaning agent and the cleaning time t (seconds) is represented by $0.25 \leq tC^{1.29} \leq 5$. Usually, in the cleaning with an aqueous hydrofluoric acid solution, if the hydrofluoric acid content in the aqueous hydrofluoric acid solution to be used is too high or if the cleaning time is too low, there will be a problem such as a dimensional change due to an increase of the etching amount, or contamination (particle contamination or watermark) caused by hydrophobicity of the silicon surface. On the other hand, if the hydrofluoric acid content is too small or the cleaning time is too short, the ability to remove metal contaminants tends to decrease.

The present inventors have conducted an extensive study on the cleaning step by means of a hydrofluoric acid-containing cleaning agent to be used in combination with the cleaning step by means of the alkaline cleaning agent, like the above-mentioned step (1) or (3). As a result, it has been found that when the specific hydrofluoric acid content C (wt %) and the specific cleaning time t (seconds) are separately defined, and in addition, both C and t are represented by the specific relation formula of $0.25 \leq tC^{1.29} \leq 5$, it is possible to solve both problems such as sufficient removal of metal contaminants on the substrate surface and the dimensional change, and the present invention has been accomplished. This value represented by $tC^{1.29}$ is from 0.25 to 5, preferably from 0.4 to 4, more preferably from 0.6 to 3. If this value is too small, metal contaminants cannot sufficiently be removed, and on the other hand, if it is too large, the etching amount increases more than necessary, thus leading to a problem such as a dimensional change or contamination (particle contaminants, or watermark) caused by hydrophobicity of the silicon surface.

(B-2) Hydrofluoric Acid Content

The hydrofluoric acid content C (wt %) in the hydrofluoric acid-containing cleaning agent to be used in the present invention is usually from 0.03 to 3 wt %, preferably from 0.1 to 1 wt %, particularly preferably from 0.2 to 0.8 wt %. If the hydrofluoric acid content is too small, the efficiency for removal of metal contaminants will be low. On the other hand, if the content is too high, a high effect corresponding to the high concentration cannot be expected, and not only that, the etching rate tends to be high, and it tends to be difficult to control the etching amount to a certain level or less, such being undesirable.

(B-3) Cleaning Time in the Step (2)

The cleaning time t (seconds) of the substrate with the hydrofluoric acid-containing cleaning agent is at most 45 seconds. The cleaning time t (seconds) may optionally be determined depending upon the hydrofluoric acid content C (wt %) in the cleaning agent so long as the above-mentioned relationship between t and C is satisfied. The cleaning time t (seconds) is preferably at most 20 seconds, more preferably at most 10 seconds, although it depends also on the above-mentioned hydrofluoric acid content C (wt %). The lower limit for the cleaning time t (seconds) may optionally be selected depending upon the desired clean level of the substrate, but it is usually at least 1 second. Further, this lower limit of the cleaning time may depends also on e.g. the movable limit of the apparatus to be used for the cleaning, but, for example, when a sheet system cleaning apparatus is employed, the lower limit of the cleaning time of the substrate with the cleaning agent may be made to be about 1 second. Within the above-mentioned range of the hydrofluoric acid content C (wt %), if the hydrofluoric acid content in the cleaning agent is made more high, efficient cleaning will be possible in a shorter cleaning time, such being desirable.

If the cleaning time in the step (2) of the present invention is too long, a contaminant removal effect corresponding to the time spent cannot be obtained, and not only that, the number of substrates which can be treated per unit time will decrease, and further when a sheet system cleaning apparatus is used, treatment of a large amount of an acid waste liquid will be required, such being undesirable.

(B-4) Solvent for the Hydrofluoric Acid-Containing Cleaning Agent

As a solvent for the hydrofluoric acid-containing cleaning agent to be used in the present invention, water, an organic solvent or a mixed solvent thereof may be mentioned. Among them, as the solvent, water is preferred from the viewpoint of the waste liquid treating cost. As such water, deionized water, preferably ultrapure water, is usually employed. However, electrolyzed water obtained by electrolysis of water, or hydrogenated water having hydrogen gas dissolved in water, by itself, has excellent particle removing ability or deposition preventing ability as compared with water and is preferably used alone as a solvent or as mixed with other solvents.

(B-5) Additives, etc. to the Hydrofluoric Acid-Containing Cleaning Agent

The hydrofluoric acid-containing cleaning agent to be used in the present invention may further contain other components. As such other components, a surfactant to be used for the alkaline cleaning agent in the step (1) or (3); an acid such as hydrochloric acid, sulfuric acid, nitric acid or acetic acid; an alkaline component such as ammonia; a buffering agent such as ammonium fluoride; an antioxidant such as hydrogen peroxide, ozone or oxygen; a reducing agent such as hydrazine, an anticorrosive such as an organic sulfur-containing compound (such as 2-mercapto thiazoline, 2-mercapto imidazoline or thioglycerol), an organic nitrogen-containing compound (such as benzotriazole, 3-aminotriazole, urea or thiourea), a water-soluble polymer (such as polyethylene glycol or polyvinyl alcohol), or an alkyl alcohol type compound, or dissolved gas such as hydrogen, argon or nitrogen, may, for example, be mentioned.

Further, the methods for preparing the cleaning agents (the alkaline cleaning agent and the hydrofluoric acid-containing cleaning agent) to be used in the present invention may be in accordance with the conventional methods. Among the components (such as ammonium hydroxide, the solvent, optional other components such as the complexing agent, the surfactant, etc.) constituting the cleaning agents, any two components or three or more components may be preliminarily blended, and thereafter, the remaining components may be mixed, or all components may be mixed all at once.

(C) Combination of the Steps (1), (2) and (3)

(C-1) Combination of the Steps (1) and (2)

The cleaning method of the present invention comprising the above-mentioned steps (1) and (2) is characterized in that the step (2) is carried out after carrying out the step (1).

By carrying out the cleaning in this order, a highly clean substrate surface can be obtained in a short time. It may be optionally selected depending upon the clean level required for the substrate surface, the types of materials present in the substrate or substrate surface, the types of additives to the cleaning agents, etc.

The alkaline cleaning agent in the step (1) contains a complexing agent. Accordingly, even when the alkaline cleaning agent contains metal impurities by chance, by the action of the complexing agent, deposition of such metal impurities on the substrate surface can be prevented, whereby not only particle contaminants but also metal contaminants may be reduced to an extremely high level, such being desirable.

Further, when a surfactant is added to the alkaline cleaning agent, depending upon the types of the surfactant and the substrate surface material, it may happen that the surfactant is adsorbed on the substrate surface and will remain in a very small amount, but such a contaminant can be removed in the step (2).

Further, between the steps (1) and (2), another step of cleaning the substrate may be carried out.

(C-2) Combination of the Steps (2) and (3)

On the other hand, the cleaning method of the present invention comprising the steps (2) and (3), is characterized in that the step (3) is carried out after carrying out the step (2). By carrying out the cleaning in this order, it is possible to obtain a substrate surface having very little particle contaminants, such being desirable. If a very small amount of particles are contained by chance in the hydrofluoric acid-containing cleaning agent, there will be a problem that such particles are likely to deposit on the substrate surface. However, such particle contaminants can effectively be removed in the step (3).

Heretofore, in the cleaning of a common silicon substrate surface covered with a natural oxide film, cleaning with an alkaline cleaning agent has been carried out after cleaning with an aqueous hydrofluoric acid solution (for example, cleaning with a 0.5 wt % hydrofluoric acid aqueous solution for one minute). However, by such a conventional method, the natural oxide film will be removed, whereby the Si surface will be exposed (and is likely to be eroded by the alkaline cleaning agent), whereby there has been a problem that this Si surface is roughened at the time of cleaning by means of the alkaline cleaning agent.

By the cleaning method of the present invention, i.e. by carrying out the step (3) after carrying out the step (2), the natural oxide film will not be completely removed in the step (2), whereby at the time of the alkaline cleaning step in the step (3), this natural oxide film will serve as a protective film for the Si surface, whereby the surface roughening can be suppressed.

Further, between the steps (2) and (3), another step of cleaning the substrate may be carried out.

(D) Other Cleaning Conditions

The cleaning in the present invention (the cleaning with the alkaline cleaning agent or with the hydrofluoric acid-containing cleaning agent) may be carried out with the liquid temperature of the cleaning agent being at room temperature. However, for the purpose of improving the cleaning effects, it may be carried out under heating. The alkaline cleaning agent in the step (1) or (3) is used usually within a range of from room temperature to 90° C. Whereas, the hydrofluoric acid-containing cleaning agent in the step (2) is used usually at room temperature, but may be heated to a level of 40° C. If the cleaning agent temperature is too high, the etching amount of the silicon oxide film or the like increases, thus leading to a side effect such as a dimensional change.

Further, at the time of the cleaning, a cleaning method by a physical force, such as mechanical cleaning such as scrubbing cleaning by means of a cleaning brush, or ultrasonic cleaning, may be used in combination. Particularly when cleaning with an alkaline cleaning agent in the step (1) or (3) is carried out by means of the after-mentioned sheet system cleaning apparatus, if ultrasonic irradiation or brush scrubbing is used in combination, the ability to remove particle contaminants can further be improved, whereby the cleaning time may be shortened, such being desirable. Further, cleaning with electrolyzed water obtained by electrolysis of water or with hydrogenated water having hydrogen gas dissolved in water may be combined before and/or after the cleaning method of the present invention.

(E) Cleaning Apparatus, etc.

The cleaning apparatus to be used in the present invention may be of any type so long as it is a cleaning apparatus capable of carrying out the cleaning method of the present invention, i.e. the method for contacting the cleaning agent directly to the substrate. As the method for contacting the cleaning agent to the substrate, a dipping system of dipping the substrate in the cleaning agent filled in a cleaning tank, a spinning system of rotating the substrate at a high speed while supplying the cleaning liquid onto the substrate from a nozzle, or a spraying system of spraying the liquid to a substrate for cleaning may, for example, be mentioned. As an apparatus to carry out such cleaning, there is a batch system cleaning apparatus whereby a plurality of substrates accommodated in a cassette are simultaneously cleaned or a sheet system cleaning apparatus whereby a single sheet of substrate is mounted on a holder and cleaned. The cleaning method of the present invention can be applied to any one of the above-mentioned methods, but preferably applied to a cleaning apparatus of a spinning system or a spraying system, since contaminant removal can efficiently be carried out in a short time. Specifically, it is preferred to apply the cleaning method of the present invention to a sheet system cleaning apparatus where shortening of the cleaning time or reduction of the amount of the cleaning agent is problematic, since such a problem can thereby be solved.

(F) Substrate, etc. to be Cleaned

The cleaning method of the present invention is used for cleaning the substrate surface of e.g. semiconductor, glass, metal, ceramics, resin, magnetic material or superconductor, where metal contaminants or particle contaminants will be problematic. Especially, it is suitably used for cleaning a substrate for a semiconductor device or a substrate for a display device, where a high clean level of the substrate surface is required. As the material for e.g. these substrates and wirings or electrodes present on their surface, a semiconductor material such as Si, Ge (germanium) or GaAs (gallium arsenide); an insulating material such as $SiO_2$, silicon nitride, hydrogen silsesquioxane (HSQ), glass, aluminum oxide, a transition metal oxide (such as titanium oxide, tantalum oxide, hafnium oxide or zirconium oxide), (Ba, Sr)TiO$_3$ (BST), a polyimide, or an organic thermosetting resin; a metal such as W (tungsten), Cu (copper), Cr (chromium), Co (cobalt), Mo (molybdenum), Ru (ruthenium), Au (gold), Pt (platinum), Ag (silver) or Al (aluminum), or an alloy, silicide or nitride, may, for example, be mentioned.

Particularly, in a substrate for a semiconductor device having a semiconductor material such as silicon or an insulating material such as silicon nitride, silicon oxide or glass at a part or over the entirety of the substrate surface, reduction of metal contaminants as well as particle contaminants is strongly desired, and accordingly, the cleaning method of the present invention can be suitably used for such a substrate.

EXAMPLES

Now, specific embodiments of the present invention will be described with reference to Examples. However, it should be understood that the present invention is by no means restricted by the following Examples.

Preparation of Contaminated Silicon Wafer, etc.

A 4 or 6 inch silicon wafer was immersed in an APM cleaning agent containing metal ions (Fe, Al, Cu, Zn). This APM cleaning agent was prepared by adding an aqueous solution containing metal ions to a mixture comprising 29 wt % aqueous ammonia, a 31 wt % hydrogen peroxide aqueous solution and water in a volume ratio 1:1:5 to prepare a metal ion-containing APM cleaning agent containing 20 ppb of Fe, 1 ppb of Al, 1 ppm of Cu and 200 ppb of Zn.

The silicon wafer after the immersion was washed with ultrapure water for 10 minutes and dried by nitrogen blowing or by a spin dryer to prepare a silicon wafer contaminated with metals.

The analysis of metals (Fe, Al, Cu, Zn) present on this silicon wafer was carried out by the same method for both the contaminated silicon wafer and the silicon wafer after cleaning. In the method, an aqueous solution containing 0.1 wt % of hydrofluoric acid and 1 wt % of hydrogen peroxide, was contacted to the wafer surface and recovered. And the amounts of recovered metals were measured by means of an inductively coupled plasma mass spectrometer (ICP-MS) and converted to the substrate surface concentration (atoms/cm$^2$), which was used as analytical results. Further, the total value of all of these metal concentrations was designated as "the total metal concentration (atoms/cm$^2$)". The analytical results of the contaminated silicon wafer are shown in Tables 1—1 and 1—2.

Example 1

Evaluation of the Metal Contaminant-Cleaning Performance by Two Step Cleaning: Steps (1) and (2)

The silicon wafer contaminated with metals, was subjected to cleaning of metal contaminants by a two step cleaning method comprising the steps (1) and (2) as identified in Table 1—1 by means of a sheet system cleaning apparatus. The order of the steps (1) and (2) is also identified in the Table. Namely, the case wherein the step (2) is carried out after the step (1), is identified as "1→2". Hereinafter, the same applies in all Tables.

In the step (1), a cleaning agent prepared by adding the complexing agent as identified in Table 1—1 to an APM1 cleaning agent (an aqueous solution prepared by mixing 29 wt % aqueous ammonia, a 31 wt % hydrogen peroxide aqueous solution and water in a volume ratio of 1:2:80), was used. Further, the pH of the cleaning agent used in the step (1) was about 10. In the sheet system cleaning apparatus, the silicon wafer rotational speed was 1000 rpm, the flow rate of the cleaning agent was 1 litter/min, the cleaning time was 30 seconds, and the liquid temperature was 80° C.

In the step (2), an aqueous hydrofluoric acid solution having the hydrofluoric acid content as identified in Table 1—1, was used. In the sheet system cleaning apparatus, the silicon wafer rotational speed was 600 rpm, the flow rate of the cleaning agent was 1 litter/min, cleaning was carried out for a cleaning time as identified in Table 1—1, and the liquid temperature was room temperature. The results of this two step cleaning are shown in Table 1—1.

Comparative Examples 1 and 2

Cleaning was carried out in the same manner as in Example 1 except that the step (1) was not carried out, and as the cleaning agent in the step (2), a HPM cleaning agent (an aqueous solution prepared by mixing 35 wt % hydrochloric acid, a 31 wt % hydrogen peroxide aqueous solution and water in a volume ratio of 1:1:80) was used, the liquid temperature was changed to 60° C., and the cleaning time was as identified in Table 1—1. The results are shown in Table 1—1.

Comparative Example 3

Cleaning was carried out in the same manner as in Example 1 except that the step (2) was not carried out, and as the cleaning agent in the step (1) the same APM1 cleaning agent as in Example 1 was used without incorporating the complexing agent. The results are shown in Table 1—1.

Comparative Example 4

Cleaning was carried out in the same manner as in Example 1 except that as the cleaning agent in the step (1), the same APM1 cleaning agent as in Example 1 was used without incorporating the complexing agent, and as the cleaning agent in the step (2), the same HPM cleaning liquid as in Comparative Example 1 was used, and the liquid temperature was changed to 60° C., and the cleaning time was as identified in Table 1—1. The results are shown in Table 1—1.

Example 2

Cleaning was carried out in the same manner as in Example 1 except that in the step (1), the cleaning time was changed to 60 seconds, and the liquid temperature was changed to 50° C., and in the step (2), as the cleaning agent, an aqueous hydrofluoric acid solution having a hydrofluoric acid content as identified in Table 1—1 was used, the cleaning time was as identified in Table 1—1, and the liquid temperature was room temperature. The results are shown in Table 1—1.

TABLE 1-1

| | | Step (1) | | | Step (2) | | | Metal concentrations ($\times 10^{10}$ atoms/cm$^2$) | | | | |
|---|---|---|---|---|---|---|---|---|---|---|---|---|
| | Order of steps | Type of cleaning agent | Complexing agent Type | Concentration (ppm) | Type of cleaning agent | Hydrofluoric acid content C (wt %) | Time t (sec.) | tc$^{1.29}$ | Fe | Al | Cu | Zn | Total metals |
| Ex. 1 | 1→2 | APM1 | EDDHA | 36 | Hydrofluoric acid | 0.2 | 5 | 0.63 | 1.9 | <3.0 | <1.0 | <0.5 | 6.4 |
| Ex. 2 | 1→2 | APM1 | EDDHA | 36 | Hydrofluoric acid | 0.5 | 7 | 2.86 | <0.5 | <3.0 | 1.4 | <0.5 | 5.4 |
| Comp. Ex. 1 | 2 | — | — | — | HPM | — | 30 | — | 18.8 | 5.0 | 5.4 | 1.6 | 30.8 |
| Comp. Ex. 2 | 2 | — | — | — | HPM | — | 5 | — | 60.8 | 10.5 | 8.0 | 2.4 | 81.7 |
| Comp. Ex. 3 | 1 | APM1 | — | — | — | — | — | — | 11500.0 | 74.2 | 1.5 | 964.0 | 12539.7 |
| Comp. Ex. 4 | 1→2 | APM1 | — | — | HPM | — | 30 | — | 7.7 | 6.6 | 7.2 | 1.3 | 22.8 |
| Before cleaning (silicon wafer contaminated with metals) | | | | | | | | | 1000–3000 | 400–600 | 3000–5000 | 4000–6000 | 8400–14600 |

Examples 3 to 7 and Comparative Examples 5 and 6

In the step (1), as the cleaning agent, an APM2 cleaning agent (an aqueous solution prepared by mixing 29 wt % aqueous ammonia, a 31 wt % hydrogen peroxide aqueous solution and water in a volume ratio of 1:2:40) or one having a complexing agent or a surfactant as identified in Table 1—2 added thereto, was used, and the cleaning time in the step (1) was 60 seconds, and the liquid temperature was 80° C. The pH of the cleaning agent used in the step (1) was about 10.5. Except for the foregoing, this step was carried out in the same manner as in the step (1) in Example 1.

Further, in the step (2), cleaning was carried out in the same manner as in Example 1 except that as the cleaning agent, an aqueous hydrofluoric acid solution having a hydrofluoric acid content as identified in Table 1—2 was used, and the cleaning time and the order of steps are likewise as identified in Table 1—2. The results are shown in Table 1—2.

TABLE 1-2

| | | Step (1) | | | | | Step (2) | | | |
|---|---|---|---|---|---|---|---|---|---|---|
| | Order of steps | Type of cleaning agent | Complexing agent Type | Concentration (ppm) | Surfactant Type | Concentration (ppm) | Type of cleaning agent | Hyrdrofluoric acid content C (wt %) | Time t (sec.) | tc$^{1.29}$ |
| Ex. 3 | 1→2 | APM2 | EDDHA | 70 | — | — | Hydrofluoric acid | 0.2 | 5 | 0.63 |
| Ex. 4 | 1→2 | APM2 | EDDHA | 70 | — | — | Hydrofluoric acid | 0.5 | 7 | 2.86 |
| Ex. 5 | 1→2 | APM2 | EDTA | 70 | — | — | Hydrofluoric acid | 0.5 | 7 | 2.86 |
| Ex. 6 | 1→2 | APM2 | NTPO | 70 | — | — | Hydrofluoric acid | 0.5 | 7 | 2.86 |
| Ex. 7 | 1→2 | APM2 | RDDHA | 70 | $C_{12}H_{25}O(C_2H_{40})_{11}H$ | 70 | Hydrofluoric acid | 0.5 | 7 | 2.86 |
| Comp. Ex. 5 | 1→2 | APM2 | — | — | — | — | Hydrofluoric acid | 0.2 | 5 | 0.63 |
| Comp. Ex. 6 | 1→2 | APM2 | EDDHA | 70 | — | — | Hydrofluoric acid | 0.01 | 7 | 0.02 |
| Before cleaning (silicon wafer contaminated with metals) | | | | | | | | | | |

| | Metal concentrations ($\times 10^{10}$ atoms/cm$^2$) | | | | |
|---|---|---|---|---|---|
| | Fe | Al | Cu | Zn | Total Metals |
| Ex. 3 | <0.1 | 1.2 | <0.2 | <0.3 | 1.8 |
| Ex. 4 | <0.1 | <0.5 | <0.2 | <0.3 | 1.1 |
| Ex. 5 | <0.1 | <0.5 | <0.2 | <0.3 | 1.1 |
| Ex. 6 | <0.1 | <0.5 | <0.2 | <0.3 | 1.1 |

TABLE 1-2-continued

| | | | | | |
|---|---|---|---|---|---|
| Ex. 7 | <0.1 | <0.5 | <0.2 | <0.3 | <1.1 |
| Comp. Ex. 5 | 2.9 | 0.9 | <0.2 | <0.3 | 4.3 |
| Comp. Ex. 6 | 9.9 | 4.6 | <0.2 | <0.3 | 15.0 |
| | 1000–2000 | 100–300 | 10000–20000 | 5000–9000 | 16100–31300 |

As shown in Tables 1—1 and 1—2, in the present invention wherein the step (1) of carrying out cleaning by means of a complexing agent-containing alkaline cleaning agent and the step (2) of carrying out cleaning by means of an aqueous hydrofluoric acid solution, are combined, it is evident that the total metal concentration on the silicon wafer surface is clearly small, and the cleaning performance against metal contaminants is excellent. It is also evident that as compared with the conventional HPM cleaning, APM cleaning or a cleaning method composed of their combination (RCA cleaning), the cleaning method of the present invention is superior in the metal contaminant-cleaning performance.

Examples 8 to 12 and Comparative Example 7
Evaluation of the Particle Contaminant-Cleaning Performance: Steps (1) and (2)

A silicon wafer having from 1000 to 3000 $Si_3N_4$ particles having a particle size of at least 0.13 μm, deposited within a circle of 6 inches on a substrate, was cleaned by a two step method comprising the steps (1) and (2) as identified in Table 2 by means of a sheet system cleaning apparatus, to carry out cleaning of the particles.

In the step (1) cleaning was carried out by using a cleaning agent having a complexing agent added to the APM2 cleaning agent or a cleaning agent prepared by further adding the surfactant as identified in Table 2 thereto. In the sheet system cleaning apparatus, the silicon wafer rotational speed was 1000 rpm. The amount of the cleaning liquid was 1 litter/min, the cleaning time was 60 seconds, the liquid temperature was room temperature, and cleaning was carried out while applying an ultrasonic irradiation to the substrate. Further, the pH of the cleaning agent used in this step (1) was about 10.3.

As the cleaning agent in the step (2), an aqueous hydrofluoric acid solution having a hydrofluoric acid content as shown in Table 2 was used. In the sheet system cleaning apparatus, the silicon wafer rotational speed was 1000 rpm, the amount of the cleaning liquid was 1 litter/min, the cleaning time was as shown in Table 2, and the liquid temperature was room temperature. And, the order of the steps (1) and (2) was as identified in Table 2.

The contaminant particle removal rate was evaluated by the following five grades, based on the removal rates obtained from the measurements of the number of particles remaining on the cleaned silicon wafer surface obtained after the cleaning.

Namely, a removal rate of at least 80% was designated as AAA, a removal rate of at least 60% and less than 80% was designated as AA, a removal rate of at least 40% and less than 60% was designated as A, a removal rate of at least 20% and less than 40% was designated as B, and a removal rate of less than 20% was designated as C. The results are shown in Table 2.

Comparative Example 8

Cleaning was carried out in the same manner as in Example 8 except that as the cleaning agent in the step (2), the same HPM cleaning agent as used in Comparative Example 1 was used, and the liquid temperature was changed to 60° C., and the cleaning time was as shown in Table 2. The results are shown in Table 2.

TABLE 2

| | | Step (1) | | | | | Step (2) | | | | |
|---|---|---|---|---|---|---|---|---|---|---|---|
| | | | Complexing agent | | Surfactant | | Hydrofluoric | | | | |
| | | Type | | | | | | | | | |
| | Order of steps | of cleaning agent | Type | Concentration (ppm) | Type | Concentration (ppm) | Type of cleaning agent | acid content C (wt %) | Time t (sec.) | $tc^{1.29}$ | Particle removal rate |
| Ex. 8 | 1→2 | APM2 | EDDHA | 70 | Nil | — | Hydrofluoric acid | 0.5 | 7 | 2.86 | B |
| Ex. 9 | 1→2 | APM2 | EDDHA | 70 | $C_{12}H_{25}O(C_2H_4O)_{11}H$ | 70 | Hydrofluoric acid | 0.5 | 7 | 2.86 | AA |
| Ex. 10 | 1→2 | APM2 | EDDHA | 70 | $C_{12}H_{25}O(C_2H_4O)_{13}H$ | 70 | Hydrofluoric acid | 0.5 | 7 | 2.86 | A |
| Ex. 11 | 1→2 | APM2 | EDDHA | 70 | $C_{12}H_{25}-C_6H_4-SO_3H$ | 70 | Hydrofluoric acid | 0.5 | 7 | 2.86 | AA |
| Ex. 12 | 1→2 | APM2 | EDDHA | 70 | $C_{18}H_{35}O(C_2H_4O)_{30}H$ | 70 | Hydrofluoric acid | 0.5 | 7 | 2.86 | A |
| Comp. Ex. 7 | 1→2 | APM2 | — | — | — | — | Hydrofluoric acid | 0.5 | 7 | 2.86 | C |
| Comp. | 1→2 | APM2 | — | — | — | — | HPM | — | 30 | — | B |

TABLE 2-continued

| | | Step (1) | | | | Step (2) | | | |
| | | Complexing agent | | Surfactant | | Hydrofluoric | | | |
| Type | | | | | | | | | |
| Order of of cleaning steps agent | Type | Concentration (ppm) | Type | Concentration (ppm) | Type of cleaning agent | acid content C (wt %) | Time t (sec.) | $tc^{1.29}$ | Particle removal rate |
| Ex. 8 | | | | | | | | | |
| | | Before cleaning (silicon wafer contaminated with $Si_3N_4$ particles) | | | | | | | 1000–3000 |

As shown in Table 2, as compared with the conventional RCA cleaning method having the APM cleaning and the HPM cleaning combined, it is evident that the cleaning method of the present invention is distinctly superior in the particle contaminant-cleaning performance.

Example 13 and Comparative Example 9
Evaluation of the Dimensional Change of the Silicon Wafer after Cleaning By means of a sheet system cleaning apparatus, cleaning was carried out against a 4 inch silicon wafer having an oxide film attached thereto by using an aqueous hydrofluoric acid solution having a hydrofluoric acid content as identified in Table 3, whereby the dimensional change of the silicon wafer was evaluated.

In the sheet system cleaning apparatus, the silicon wafer rotational speed was 600 rpm, the flow rate of the cleaning liquid was 1 litter/min, the liquid temperature was room temperature, and the washing time was as shown in Table 3. A case wherein the etching amount of the wafer surface (the etched film thickness) exceeds 10 (Å), was designated as "bad", and a case where it is not more than 10 (Å), was designated as "good".

Inspection of the State of the Silicon Wafer Surface after Cleaning 1 ml of water was dropped on the silicon wafer surface after cleaning, and the state of the surface was inspected. The results are shown in Table 3.

TABLE 3

| | | Step (2) | | | | |
| | Type of cleaning agent | Hydrofluoric acid content C (wt %) | Time t (sec.) | $tc^{1.29}$ | Etching | State of the surface |
|---|---|---|---|---|---|---|
| Ex. 13 | Hydrofluoric acid | 0.5 | 5 | 2.04 | Good | Entirely hydrophilic |
| Comp. Ex. 9 | Hydrofluoric acid | 0.5 | 32 | 13.09 | Bad | Entirely hydrophilic |

As shown in Table 3, in the present invention wherein $tC^{1.25}$ is at most 5, where C is the hydrofluoric acid content, and t is the cleaning time by this hydrofluoric acid-containing cleaning liquid, it is evident that etching is distinctly good, and the silicon wafer surface maintains hydrophilicity, whereby the oxide film is not excessively etched, and the dimensional change is little, such being desirable.

Examples 14 and 15
Evaluation of the Metal Contaminant-Cleaning Performance by Two Step Cleaning: Steps (2) and (3)

In the same manner as in Example 1, the silicon wafer contaminated with metals was subjected to cleaning of metal contaminants by a two step cleaning method comprising the steps (2) and (3) as identified in Table 4—1 by means of a sheet system cleaning apparatus. And, evaluation was carried out in the same manner as in Example 1. Further, the order of the steps (2) and (3) is also identified in the Table. Namely, a case wherein the step (3) is carried out after the step (2), was identified by "2→3". Hereinafter, the same applies to all Tables.

In the step (2), an aqueous hydrofluoric acid solution having a hydrofluoric acid content as identified in Table 4—1 was used. In the sheet type cleaning apparatus, the silicon wafer rotational speed was 600 rpm, the flow rate of the cleaning liquid was 1 litter/min, cleaning was carried out for a cleaning time as identified in Table 4—1, and the liquid temperature was room temperature.

In the step (3), an APM1 cleaning agent (an aqueous solution prepared by mixing 29 wt % aqueous ammonia, a 31 wt % hydrogen peroxide aqueous solution and water in a volume ratio of 1:2:80) or a cleaning agent prepared by adding the complexing agent as identified in Table 4—1 thereto, was used. Further, the pH of the cleaning agent used in the step (3) was about 10. In the sheet system cleaning apparatus, the silicon wafer rotational sped was 1000 rpm, the flow rate of the cleaning liquid was 1 litter/min, the cleaning time was 30 seconds, and the liquid temperature was 80° C.

The results of this two step cleaning are shown in Table 4—1.

Example 16

In the step (2), as the cleaning agent, an aqueous hydrofluoric acid solution having a hydrofluoric acid content as identified in Table 4—1, was used, and the cleaning time was as shown in Table 4—1. Further, in the step (3), as the cleaning agent, an APM2 cleaning agent (an aqueous solution prepared by mixing 29 wt % aqueous ammonia, a 31 wt % hydrogen peroxide aqueous solution and water in a volume ratio of 1:2:40) was used, and the cleaning time was 60 seconds. The pH of the APM2 cleaning agent was about 10.5.

Except for these conditions, cleaning was carried out in the same manner as in Example 14. The results are shown in Table 4—1.

TABLE 4-1

| | Order of steps | Step (1): Type of cleaning agent | Step (1): Complexing agent: Type | Step (1): Complexing agent: Concentration (ppm) | Step (2): Type of cleaning agent | Step (2): Hydrofluoric acid content C (wt %) | Step (2): Time t (sec.) | $tc^{1.29}$ | Metal concentrations ($\times 10^{10}$ atoms/$cm^2$): Fe | Al | Cu | Zn | Total metals |
|---|---|---|---|---|---|---|---|---|---|---|---|---|---|
| Ex. 14 | 2→3 | APM1 | — | — | Hydrofluoric acid | 0.2 | 5 | 0.63 | 0.9 | 6.2 | 2.3 | 7.7 | 17.1 |
| Ex. 15 | 2→3 | APM1 | EDDHA | 36 | Hydrofluoric acid | 0.2 | 5 | 0.63 | <0.5 | <3.0 | <1.0 | <0.5 | <5.0 |
| Ex. 16 | 2→3 | APM2 | — | — | Hydrofluoric acid | 0.5 | 7 | 2.86 | <0.5 | 6.1 | 1.2 | 6.0 | 13.8 |
| | | Before cleaning (silicon wafer contaminated with metals) | | | | | | | 1000–3000 | 400–600 | 3000–5000 | 4000–6000 | 8400–14600 |

Examples 17 to 22

In the step (2), as the cleaning agent, an aqueous hydrofluoric acid solution having a hydrofluoric acid content as identified in Table 4—2, was used, and the cleaning time was as shown in Table 4—2.

In the step (3), as the cleaning agent, the APM2 cleaning agent or one having the complexing agent or the surfactant as identified in Table 4—2 added thereto, was used, and the treating time was 60 seconds. The pH of this APM2 cleaning agent was about 10.5.

Except for these conditions, cleaning was carried out in the same manner as in Example 14. The results are shown in Table 4—2.

Comparative Example 10

Cleaning was carried out in the same manner as in Example 16 except that without carrying out the step (2), only the step (3) was carried out. The results are shown in Table 4—2.

TABLE 4-2

| | Order of steps | Step (1): Type of cleaning agent | Step (1): Complexing agent: Type | Step (1): Complexing agent: Concentration (ppm) | Step (1): Surfactant: Type | Step (1): Surfactant: Concentration (ppm) | Step (2): Type of cleaning agent | Step (2): Hyrdrofluoric acid content C (wt %) | Step (2): Time t (sec.) | $tc^{1.29}$ | Metal concentrations ($\times 10^{10}$ atoms/$cm^2$): Fe | Al | Cu | Zn | Total Metals |
|---|---|---|---|---|---|---|---|---|---|---|---|---|---|---|---|
| Ex. 17 | 2→3 | APM2 | — | — | — | — | Hydrofluoric acid | 0.2 | 5 | 0.63 | <0.1 | 3.8 | <0.2 | 8.0 | 12.1 |
| Ex. 18 | 2→3 | APM2 | — | — | — | — | Hydrofluoric acid | 0.5 | 7 | 2.86 | <0.1 | 3.5 | <0.2 | 6.0 | 9.8 |
| Ex. 19 | 2→3 | APM2 | EDDHA | 70 | — | — | Hydrofluoric acid | 0.5 | 7 | 2.86 | <0.1 | <0.5 | <0.2 | <0.3 | <1.1 |
| Ex. 20 | 2→3 | APM2 | EDTA | 70 | — | — | Hydrofluoric acid | 0.5 | 7 | 2.86 | <0.1 | 3.4 | <0.2 | 0.9 | 4.6 |
| Ex. 21 | 2→3 | APM2 | NTPO | 70 | — | — | Hydrofluoric acid | 0.5 | 7 | 2.86 | <0.1 | 5.3 | <0.2 | <0.3 | 5.9 |
| Ex. 22 | 2→3 | APM2 | EDDHA | 70 | $C_{12}H_{25}O(C_2H_4O)_{11}H$ | 70 | Hydrofluoric acid | 0.5 | 7 | 2.86 | <0.1 | <0.5 | <0.2 | <0.3 | <1.1 |
| Comp. Ex. 10 | 3 | APM2 | — | — | — | — | — | — | — | — | | | | | |
| | | | | Before cleaning (silicon wafer contaminated with metals) | | | | | | | | | | | |

TABLE 4-2-continued

|  | | | | | |
|---|---|---|---|---|---|
| Comp. Ex. 10 | 116.0 | 43.4 | 0.9 | 27.9 | 188.2 |
|  | 1000–2000 | 100–300 | 10000–20000 | 5000–9000 | 16100–31300 |

As shown in Tables 4—1 and 4—2, in the present invention in which the step (2) of carrying out cleaning by means of an aqueous hydrofluoric acid solution and the step (3) of carrying out cleaning by means of an alkaline cleaning agent are combined in this order, it is evident that the total metal concentration on the silicon wafer surface is distinctly small, and the cleaning performance of metal contaminants is excellent. Further, by comparing the results in Tables 4—1 and 4—2 with the results of Comparative Examples 1 to 4 as disclosed in the previous Table 1—1 which represent conventional HPM cleaning, APM cleaning and a cleaning method (RCA cleaning) composed of their combination, it is more clearly evident that the cleaning method of the present invention is superior in the metal contaminant-cleaning performance.

Examples 23 to 28
Evaluation of Particle Contaminant-Cleaning Performance: Steps (2) and (3)

A silicon wafer having from 1000 to 3000 $Si_3N_4$ particles having a particle size of at least 0.13 μm deposited within a circle of 6 inches on a substrate, was cleaned by a two step method comprising the steps (2) and (3) as identified in Table 5 by means of a sheet system cleaning apparatus, to carry out cleaning of particles.

In the step (2), as the cleaning agent, an aqueous hydrofluoric acid solution having a hydrofluoric acid content as identified in Table 5, was used. In the sheet system cleaning apparatus, the silicon wafer rotational speed was 1000 rpm, the flow rate of the cleaning liquid was 1 litter/min, the cleaning time was as shown in Table 5, and the liquid temperature was room temperature.

In the step (3) cleaning was carried out by using the APM2 cleaning agent, one having a complexing agent added thereto, or a cleaning agent prepared by further adding a surfactant as identified in Table 5 thereto. In the sheet system cleaning apparatus, the silicon wafer rotational speed was 1000 rpm, the flow rate of the cleaning liquid was 1 litter/min, the cleaning time was 60 seconds, the liquid temperature was room temperature, and cleaning was carried out while applying ultrasonic irradiation to the substrate. Further, the pH of the cleaning agent used in this step (3) was about 10.3. And, the order of the steps (2) and (3) was as shown in Table 5.

The contaminant particle removal rate was evaluated by the following five grades based on the removal rates obtained by the measurements of the number of particles remaining on the cleaned silicon wafer surface obtained after cleaning.

Namely, a removal rate of at least 80% was designated as removal performance of AAA, and a removal rate of at least 60% and less than 80% was designated as AA, a removal rate of at least 40% and less than 60% was designated as A, a removal rate of at least 20% and less than 40% was designated as B, and a removal rate of less than 20% was designated as C. The results are shown in Table 5.

Example 29

Cleaning was carried out in the same manner as in Example 23 except that the cleaning temperature in the step (3) was changed to 50° C. The results are shown in Table 5.

TABLE 5

| | | Step (1) | | | | Step (2) | | | | |
|---|---|---|---|---|---|---|---|---|---|---|
| | Type Order of of cleaning steps agent | Complexing agent Type | Concentration (ppm) | Surfactant Type | Concentration (ppm) | Type of cleaning agent | Hydrofluoric acid content C (wt %) | Time t (sec.) | $tc^{1.29}$ | Removal rate of particles |
| Ex. 23 | 2→3 APM2 | — | — | — | — | Hydrofluoric acid | 0.5 | 7 | 2.86 | A |
| Ex. 24 | 2→3 APM2 | EDDHA | 70 | — | — | Hydrofluoric acid | 0.5 | 7 | 2.86 | A |
| Ex. 25 | 2→3 APM2 | EDDHA | 70 | $C_{12}H_{25}O(C_2H_4O)_{11}H$ | 70 | Hydrofluoric acid | 0.5 | 7 | 2.86 | AA |
| Ex. 26 | 2→3 APM2 | EDDHA | 70 | $C_{12}H_{25}O(C_2H_4O)_{13}H$ | 70 | Hydrofluoric acid | 0.5 | 7 | 2.86 | AA |
| Ex. 27 | 2→3 APM2 | EDDHA | 70 | $C_{12}H_{25}-C_6H_4-SO_3H$ | 70 | Hydrofluoric acid | 0.5 | 7 | 2.86 | AA |
| Ex. 28 | 2→3 APM2 | EDDHA | 70 | $C_{18}H_{35}O(C_2H_4O)_{30}H$ | 70 | Hydrofluoric acid | 0.5 | 7 | 2.86 | AA |

TABLE 5-continued

| | | Step (1) | | | | | Step (2) | | | |
|---|---|---|---|---|---|---|---|---|---|---|
| | Type | Complexing agent | | | Surfactant | | | Hydrofluoric acid | | Removal |
| | Order of of cleaning steps agent | Type | Concentration (ppm) | Type | Concentration (ppm) | | Type of cleaning agent | content C (wt %) | Time t (sec.) | $tc^{1.29}$ | rate of particles |
| Ex. 29 | 2→3 APM2 | EDDHA | 70 | $C_{12}H_{25}O(C_2H_4O)_{11}H$ | 70 | | Hydrofluoric acid | 0.5 | 7 | 2.86 | AAA |
| | Before cleaning (silicon wafer contaminated with $Si_3N_4$ particles) | | | | | | | | | | 1000–3000 |

Examples 30 and 31

A silicon wafer having from 500 to 1000 $Si_3N_4$ particles having a particle size of at least 0.21 μm deposited within a circle of 4 inches on a substrate, was cleaned by a two step method comprising the steps (2) and (3) as identified in Table 6 by means of a sheet system washing apparatus, to carry out cleaning of particles.

In the step (2), as the cleaning agent, an aqueous hydrofluoric acid solution having a hydrofluoric acid content shown in Table 6, was used. In the sheet system cleaning apparatus, the silicon wafer rotational speed was 1000 rpm, the flow rate of the cleaning liquid was 1 litter/min, the cleaning time was as shown in Table 6, and the liquid temperature was room temperature.

In the step (3), cleaning was carried out by using a cleaning agent prepared by adding the complexing agent and the surfactant as identified in Table 6 to an APM3 cleaning agent (an aqueous solution prepared by mixing 29 wt % aqueous ammonia, a 31 wt % hydrogen peroxide aqueous solution and water in a volume ratio of 1:2:60). In the sheet system cleaning apparatus, the silicon wafer rotational speed was 1000 rpm, the flow rate of the cleaning liquid was 1 litter/min, the cleaning time was 60 seconds, the liquid temperature was 50° C., and washing was carried out while applying ultrasonic irradiation to the substrate. Further, the pH of this APM3 cleaning agent was about 10.3. And, the order of the steps (2) and (3) was as shown in Table 6.

Particles remaining on the cleaned silicon wafer surface obtained after cleaning, were measured by a laser surface inspecting apparatus. The results of the particle measurements was represented by the "removal rate (%)" of the particles.

Comparative Example 11

As the step (3), the step (1) in Comparative Example 4 was carried out, and at that time, as the cleaning agent, the APM3 cleaning agent was employed instead of the APM1 cleaning agent. Except for this, cleaning was carried out in the same manner as in Comparative Example 4, and evaluation was carried out in the same manner as Example 30. The results are shown in Table 6.

TABLE 6

| | | Step (1) | | | | | Step (2) | | | |
|---|---|---|---|---|---|---|---|---|---|---|
| | Type Order of of cleaning steps agent | Complexing agent Type | Concentration (ppm) | Surfactant Type | Concentration (ppm) | Type of cleaning agent | Hydrofluoric acid content C (wt %) | Time t (sec.) | $tc^{1.29}$ | Particle removal rate (%) |
| Ex. 30 | 2→3 APM3 | EDDHA | 47 | Nil | — | Hydrofluoric acid | 0.2 | 5 | 0.63 | 99.2 |
| Ex. 31 | 2→3 APM3 | EDDHA | 47 | Dodecyl-benzene sulfonic acid | 10 | Hydrofluoric acid | 0.2 | 5 | 0.63 | 99.4 |
| Comp. Ex. 11 | 3→2 APM3 | — | — | — | — | HPM | — | 30 | — | 93.6 |

As shown in Tables 5 and 6, as compared with the conventional RCA cleaning method composed of the combination of APM cleaning and HPM cleaning, it is evident that the cleaning method of the present invention is distinctly superior in the particle contaminant-cleaning performance.

As is evident from the foregoing results, by the cleaning method of the present invention, both metal contaminants and particle contaminants on a substrate surface can be removed in a very short time as compared with the conventional cleaning methods (Comparative Examples). In addition, it provides an excellent effect such that there is no substantial side effect such as a dimensional change by etching.

INDUSTRIAL APPLICABILITY

According to the cleaning method of the present invention, at the time of cleaning a semiconductor substrate such as a silicon wafer as an object to be cleaned, it is possible to effectively remove both metal contaminants and particle contaminants on the substrate surface in an extremely short time, while suppressing a problem such as a dimensional change against the substrate to an extremely low level. Accordingly, it is industrially very useful, when it is used as a surface treating method for e.g. cleaning contaminants in a process for producing semiconductor devices or display devices.

Further, the entire disclose in the specification of Japanese Patent Application No. 2001-151960 filed in May 22, 2001 is incorporated herein by reference in its entirety.

What is claimed is:

1. A method for cleaning a surface of a substrate, which comprises at least the following steps (1) and (2), wherein the step (2) is carried out after carrying out the step (1):

Step (1): A cleaning step of cleaning the surface of the substrate with an alkaline cleaning agent containing a complexing agent, and Step (2): A cleaning step employing a cleaning agent having a hydrofluoric acid content C (wt %) of from 0.03 to 3 wt %, wherein the cleaning time t (seconds) of the substrate with said cleaning agent is at most 45 seconds, and C and t satisfy the relationship of $0.25 \leq tC^{1.29} \leq 5$.

2. The method for cleaning a surface of a substrate according to claim 1, wherein the complexing agent is a compound having nitrogen as a donor atom, and a carboxyl group and/or a phosphonic acid group.

3. The method for cleaning a surface of a substrate according to claim 2, wherein the complexing agent is a compound having an aromatic hydrocarbon ring, and at least two OH groups and/or O⁻ groups directly bonded to carbon atoms constituting said ring.

4. The method for cleaning a surface of a substrate according to claim 3, wherein the complexing agent is one or more selected from the group consisting of ethylenediamine tetracetic acid (EDTA), ethylenediamine di-o-hydroxyphenylacetic acid (EDDHA) and/or its derivatives, diethylenetriamine pentacetic acid (DTPA), and propylenediamine tetra(methylenephosphonic arid) (PDTMP).

5. The method for cleaning a surface of a substrate according to claim 1, wherein the concentration of the complexing agent in the cleaning agent used in the step (1) is from 1 to 10,000 wt ppm.

6. The method for cleaning a surface of a substrate according to claim 1, wherein the cleaning agent used in the step (1) contains ammonium hydroxide.

7. The method for cleaning a surface of a substrate according to claim 6, wherein the pH of the cleaning agent used in the step (1) is at least 9.

8. The method for cleaning a surface of a substrate according to claim 1, wherein C is from 0.1 to 1 wt %.

9. The method for cleaning a surface of a substrate according to claim 8, wherein C is from 0.2 to 0.8 wt %.

10. A method for cleaning a surface of a substrate, which comprises at least the following steps (2) and (3), wherein the step (3) is carried out after carrying out the step (2):

Step (2): A cleaning step employing a cleaning agent having a hydrofluoric acid content C (wt %) of from 0.03 to 3 wt %, wherein the cleaning time t (seconds) of the substrate with said cleaning agent is at most 45 seconds, and C and t satisfy the relationship of $0.25 \leq tC^{1.29} \leq 5$, and Step (3): A cleaning step of cleaning the surface of the substrate with an alkaline cleaning agent.

11. The method for cleaning a surface of a substrate according to claim 10, wherein the cleaning agent used in the step (3) contains a complexing agent.

12. The method for cleaning a surface of a substrate according to claim 11, wherein the complexing agent is a compound having nitrogen as a donor atom, and a carboxyl group and/or a phosphonic acid group.

13. The method for cleaning a surface of a substrate according to claim 12, wherein the complexing agent is a compound having an aromatic hydrocarbon ring, and at least two OH groups and/or O⁻ groups directly bonded to carbon atoms constituting said ring.

14. The method for cleaning a surface of a substrate according to claim 13, wherein the complexing agent is one or more selected from the group consisting of ethylenediamine tetracetic acid (EDTA), ethylenediamine di-o-hydroxyphenylacetic acid (EDDHA) and/or its derivatives, diethylenetriamine pentacetic acid (DTPA), and propylenediamine tetra(methylenephosphonic acid) (PDTMP).

15. The method for cleaning a surface of a substrate according to claim 11, wherein the concentration of the complexing agent in the cleaning agent used in the step (3) is from 1 to 10,000 wt ppm.

16. The method for cleaning a surface of a substrate according to claim 10, wherein the cleaning agent used in the step (3) contains ammonium hydroxide.

17. The method for cleaning a surface of a substrate according to claim 16, wherein the pH of the cleaning agent used in the step (3) is at least 9.

18. The method for cleaning a surface of a substrate according to claim 10, wherein C is from 0.1 to 1 wt %.

19. The method for cleaning a surface of a substrate according to claim 18, wherein C is from 0.2 to 0.8 wt %.

* * * * *